United States Patent
Larsson et al.

[11] Patent Number: 6,081,905
[45] Date of Patent: Jun. 27, 2000

[54] METHOD AND APPARATUS FOR GENERATING A CLOCK SIGNAL FROM A PLURALITY OF CLOCK PHASES

[75] Inventors: Patrik Larsson, Matawan; Jay Henry O'Neill, Freehold, both of N.J.

[73] Assignee: Lucent Technologies Inc., Murray Hill, N.J.

[21] Appl. No.: 09/041,717

[22] Filed: Mar. 13, 1998

[51] Int. Cl.[7] .................................................. G06F 1/04
[52] U.S. Cl. ............................. 713/503; 327/147; 331/25
[58] Field of Search ..................................... 713/500, 501, 713/503, 400; 327/156, 159, 147, 150; 331/25, 1 A

[56] References Cited

U.S. PATENT DOCUMENTS

| | | | |
|---|---|---|---|
| 5,218,314 | 6/1993 | Efendovich et al. | 327/152 |
| 5,574,757 | 11/1996 | Ogawa | 327/156 X |
| 5,646,968 | 7/1997 | Kovacs et al. | 327/158 X |
| 5,663,687 | 9/1997 | Kozu | 327/156 X |

OTHER PUBLICATIONS

J. Sonntag & R.H. Leonowich, "A Monolithic CMOS 10MHz DPLL for Burstmode Data Retiming", pp. 194–195, International Solid–State Circuits Conference (1990).

*Primary Examiner*—Thomas M. Heckler

[57] ABSTRACT

A PLL circuit for selecting a clock signal from among a plurality of clock signals having different phases is disclosed. The PLL circuit includes a selector for selecting at least one of the plurality of clock signals. Duty cycle distortion is avoided by ensuring that at least one of the clock signals is always selected to drive the output of the PLL circuit, $P_{out}$. In one implementation, at least two of the clock signals are selected at a given time, so that at least one of the selected signals is always driving the output during a transition from one set of selected clock signals to another set of selected clock signals. In another implementation, the selector activates a desired clock signal before deactivating the currently selected clock signal, so that at least one of the clock signals is always selected. More than two phases can be simultaneously selected, for example, if there is a large capacitive load on the output signal, $P_{out}$. The PLL circuit can be programmed to select only one clock phase at lower clock speeds.

47 Claims, 5 Drawing Sheets

METHOD AND APPARATUS FOR GENERATING A CLOCK SIGNAL FROM A PLURALITY OF CLOCK PHASES

FIELD OF THE INVENTION

The present invention relates to clock recovery circuits, and more particularly, to circuits that recover the clock from incoming data by generating a number of clock signals having the same frequency, but different phases, and then selecting one of the generated clock phases to sample the incoming data signal.

BACKGROUND OF THE INVENTION

Phase-locked loop (PLL) circuits are frequently utilized to lock an oscillator in phase with a reference signal. PLL circuits are often utilized within receivers in digital communication systems to generate a local clock signal that is phase aligned with an incoming reference signal. The phase aligned local clock signal facilitates the receipt and processing of data sent by a transmitter in the communication system.

Figure 1A:
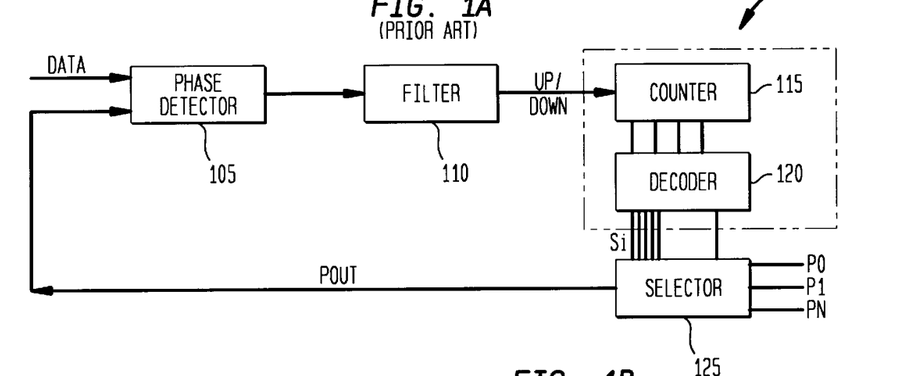
FIG. 1A schematic block diagram illustrating a conventional PLL circuit that selects one of a plurality of clock phases to generate an output signal, $P_{out}$, that is in phase with a reference signal.

Many communication systems utilize receivers that recover the clock signal from the incoming data sequence, typically using a PLL circuit. FIG. 1A shows a conventional PLL circuit 100 that includes a phase detector 105, a filter 110, a counter 115, a decoder 120 and a selector 125. In the conventional PLL circuit, the phase detector 105 compares the incoming data sequence and the output, $P_{out}$, of the selector 125. The phase detector 105 generates an error signal that is representative of the phase difference of the reference signal and the output, $P_{out}$, of the selector 125. The error signal is filtered by the filter 110 and applied to the counter 115, to indicate whether the phase of the output signal, $P_{out}$, should be increased or decreased. The counter 115 typically generates a binary number, indicating which of a plurality of input signals, $P_0$ through $P_N$, should be selected as the output signal, $P_{out}$, in order to achieve the desired phase adjustment, such that the output signal, $P_{out}$, is phase aligned with the incoming data sequence. The decoder 120 converts the received binary value into a "high" logic value on the appropriate selector line, $S_i$.

Figure 1B:
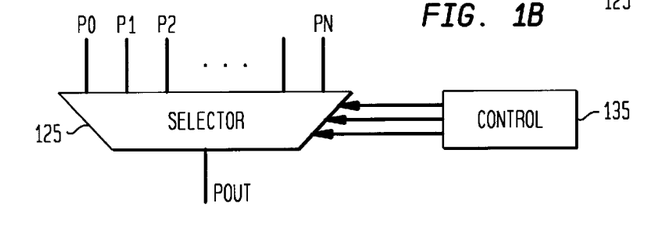
FIG. 1B is a schematic block diagram illustrating an example of the control and selector circuitry of the PLL circuit of FIG. 1A.
Figure 1C:
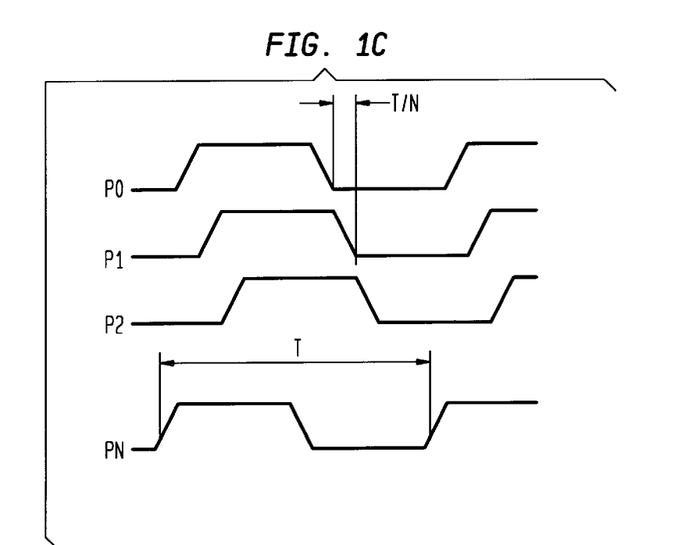
FIG. 1C illustrates the various input clock signals, $P_0$ through $P_N$, that may be selected as the output signal $P_{out}$ by the selector of FIGS. 1A and 1B.

As shown more clearly in FIGS. 1B and 1C, the selector 125 increases or decreases the phase of the output signal, $P_{out}$, by selecting an appropriate input signal, $P_0$ through $P_N$. The input signals, $P_0$ through $P_N$, are generated by a local multi-output oscillator (not shown), such that each input signal, $P_0$ through $P_N$, has the same frequency and a phase offset relative to each other equal to the inverse of the number of input signals multiplied by the oscillator period. In other words, if there are sixteen input signals, $P_0$ through $P_{15}$, each successive input signal has a phase difference of one-sixteenth the period. The frequency of the input signals, $P_0$ through $P_N$, is selected to be equal to the frequency of the transmitter (not shown) in the communication system, within a predefined tolerance. For a detailed discussion of an illustrative conventional receiver architecture and clock recovery, see J. Sonntag & R. H. Leonowich, "A Monolithic CMOS 10 MHz DPLL for Burstmode Data Retiming", pp. 194–195, International Solid-State Circuits Conference (1990), incorporated by reference herein.

A potential problem exists, however, for a PLL circuit that selects a clock signal from one of a plurality of locally generated phase-shifted oscillator signals. Specifically, as discussed further below in conjunction with FIGS. 2A through 2C, the output, $P_{out}$, of the selector 125 may have a missing or severely degraded pulse, such as the pulse 175 shown in FIG. 1D, if the selector line inputs, $S_i$, produced by the decoder 120, are changed during a transition of the selected clock phase or the desired clock phase. In addition, since conventional selector circuits 125 turn off the currently selected clock phase signal before activating the desired clock phase signal, neither clock signal drives the output signal, $P_{out}$, during the transition period and the value of the output signal, $P_{out}$, can vary unpredictably between a "high" logic value and a "low" logic value.

Figure 1D:
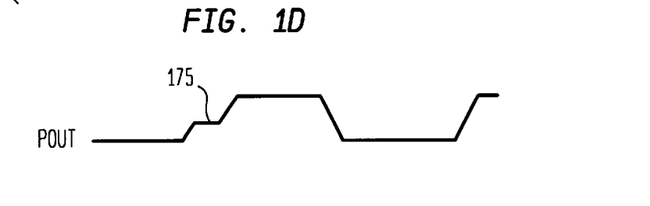
FIG. 1D illustrates a distorted output pulse, $P_{out}$, produced by the PLL of FIG. 1A in the presence of duty cycle distortion.

The pulse shown in FIG. 1D is frequently said to suffer from duty cycle distortion, since the likelihood of a "high" logic value and a "low" logic value are no longer each fifty percent (50%). As a result, the sampling of incoming data performed by the receiver, for example, using D-type flip-flops, may be corrupted. In addition, if the generated clock signal is utilized to clock the control logic 135 (FIG. 1 A) additional timing problems can be encountered.

Such duty cycle distortion can be avoided by operating the selector 125 at a much higher speed than the clock frequency, since the decoder 120 can change the values of the selector line inputs, $S_i$, only when the selected input signal, $P_N$, and its neighboring clock phases, $P_{N\pm 1}$, are not in transition. When the clock frequency is approaching or exceeding the switching speed of the selector 125, however, the decoder 120 cannot guarantee that the values of the selector line inputs, $S_i$, will be changed only when the selected input signal, $P_N$, and the desired clock phase, $P_{N\pm 1}$, are not in transition.

SUMMARY OF THE INVENTION

We have recognized that duty cycle distortion can be avoided in a PLL circuit that selects from among a plurality of clock signals having different phases, in accordance with principles of the present invention, by ensuring that at least one of the clock signals is always selected to drive the output of the PLL circuit, $P_{out}$.

In one implementation, the PLL circuit ensures that at least one of the clock signals is always selected by selecting at least two of the clock signals at a given time, so that at least one of the selected signals is always driving the output during a transition from one set of selected clock signals to another set of selected clock signals. In another implementation, the selector activates a desired clock signal before deactivating the currently selected clock signal, so that at least one of the clock signals is always selected.

According to an aspect of the invention, more than two phases can be simultaneously selected. For example, if there is a large capacitive load on the output signal, $P_{out}$, it may be advantageous to simultaneously select more than two clock phases. If three phases are selected at the same time, it is guaranteed that at least two will be active during any transition of the select signals. The phase of the output signal, $P_{out}$, will be approximately the average of the phases of the selected clock signals (plus delay effects).

According to another aspect of the invention, the PLL circuit is programmable to select only one clock phase at lower clock speeds, where the phases of the input signals, $P_0$ through $P_N$, have a large spacing. At such lower frequencies, $P_0$ can be high while $P_1$ is low, resulting in $P_0$ pulling $P_{out}$ high at the same time as $P_1$ pulls $P_{out}$ low. During testing or other low-speed operation (where a large spacing can be expected between the phases), only a single stage is activated to select a phase.

DETAILED DESCRIPTION

Figure 2A:
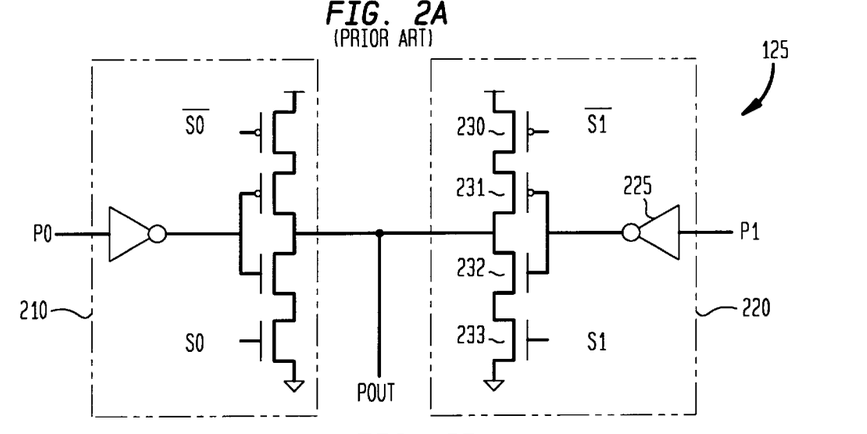
FIG. 2A is a schematic diagram illustrating a portion of the conventional selector circuit of FIGS. 1A and 1B.
Figure 2B:
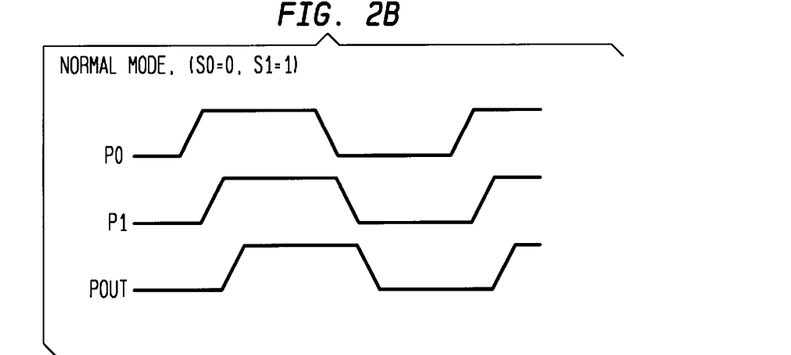
FIG. 2B illustrates the selection of $P_1$ as the output signal, $P_{out}$, by the selector circuit of FIG. 2A when th selector line input, $S_1$, has a high logic value.

FIG. 2A illustrates a portion of one possible implementation of the conventional selector 125 in FIG. 1A. The selector 125 shown in FIG. 2A consists of two stages 210, 220, each having one inverter 225 and four transistors 230–233, such as metal oxide semiconductor (MOS) transistors. During normal operation, one of the input signals, $P_0$ or $P_1$, is selected by placing a "high" logic value on the corresponding selector line input, $S_0$ or $S_1$, as shown in FIG. 2B, where $P_{out}=P_1$. FIG. 2B assumes that the selector 125 of FIG. 2A is operating without duty cycle distortion, for example, by operating the selector 125 at a much higher speed than the clock frequency and ensuring that the values of the selector line inputs, $S_0$, $S_1$, are not changed when the selected and desired input signal, $P_0$, $P_1$ are in transition.

Figure 2C:
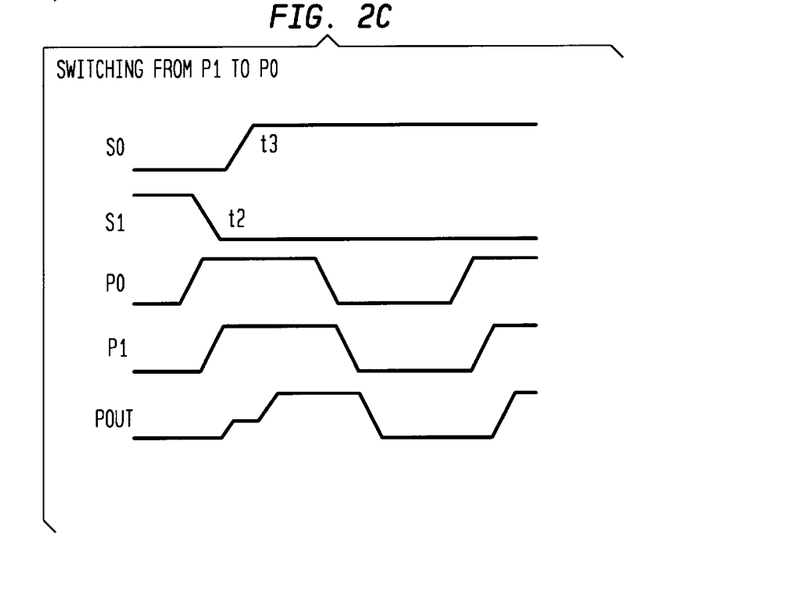
FIG. 2C illustrates the duty cycle distortion produced by the selector circuit of FIG. 2A when the selected input signal is changed from $P_1$ to $P_0$ near a transition of either $P_0$ or $P_1$.

As previously indicated, the selector 125 can generate an output signal, $P_{out}$, exhibiting duty cycle distortion, if the output signal, $P_{out}$, is switched from $P_1$ to $P_0$, when either $P_0$ or $P_1$ is in transition. As shown in FIG. 2C, the output signal, $P_{out}$, is initially rising when $P_1$ is rising (taking into account delay effects). Thereafter, at a time, $t_2$, the selector line input, $S_1$, is switched from a "high" logic value to a "low" logic value. Thus, following time $t_2$, (until time $t_3$) no stage circuit 210, 220 is driving the output signal, $P_{out}$, and thus the value of the output signal, $P_{out}$, can vary between a "high" logic value and a "low" logic value, causing duty cycle distortion, as shown in FIG. 2C. When the selector line input, $S_0$, is switched from a "low" logic value to a "high" logic value, at time $t_3$, the second stage circuit 220 will then drive the output signal, $P_{out}$, and the output signal, $P_{out}$, will follow $P_0$ (taking into account delay effects). It is noted that the delay effects are the function of the delays introduced by the inverter 225 and the four transistors 230–233 in each stage 210, 220. Thus, with conventional PLL circuits, a clean logic pulse can be obtained for the output signal, $P_{out}$, only if the arrival times of $S_0$ and $S_1$ are carefully tuned.

Figure 3A:
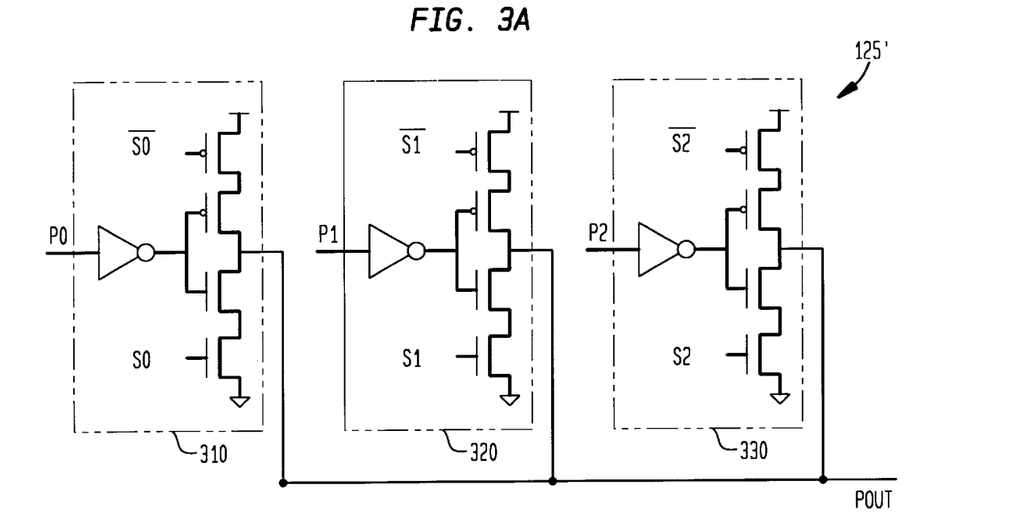
FIG. 3A illustrates a three-stage portion of the selector circuit of FIGS. 1A and 1B.

According to a feature of the present invention, duty cycle distortion is avoided by ensuring that two neighboring clock phases are simultaneously selected during a transition to ensure that at least one of the clock phases passes through the selector 125 at a given time and thereby avoid a missing or degraded pulse. FIG. 3A illustrates a three-stage portion selector 125' of the conventional selector circuit of FIGS. 1A and 1B, as modified herein to incorporate the features and functions of the present invention. In the selector 125' of FIG. 3A, two drivers are selected simultaneously to generate the output signal, $P_{out}$.

Figure 3B:
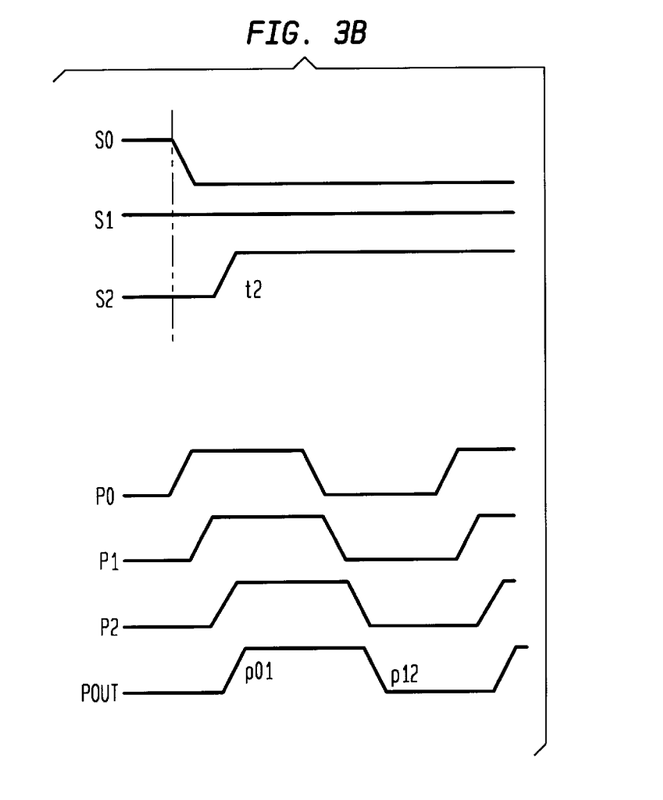
FIG. 3B illustrates the various selector line inputs, $S_0$ through $S_2$, and input clock signals, $P_0$ through $P_2$, for the selector of FIG. 3A, and the corresponding undistorted output signal, $P_{out}$, in accordance with a feature of the present invention.

FIG. 3B illustrates the various selector line inputs, $S_0$ through $S_2$, and the corresponding input clock signals, $P_0$ through $P_2$, and output signal, $P_{out}$, for the selector of FIG. 3A. Initially, $S_0$ and $S_1$ are both high to select both $P_0$ and $P_1$. In this case, the phase of the output signal, $P_{out}$, will be approximately the average phase of $P_0$ and $P_1$, somewhere in between the phase of $P_0$ and $P_1$ (called $P_{01}$,) (plus delay effects). Thereafter, starting at a time $t_2$, the selector line input, $S_0$, is switched from a "high" logic value to a "low" logic value and the selector line input, $S_2$, is switched from a "low" logic value to a "high" logic value, while the selector line input, $S_1$, remains at a "high" logic value. Thus, it is guaranteed that stage 320 will always be active and the output signal, $P_{out}$, will never float unpredictably between a "low" and "high" logic value.

Thus, according to a feature of the present invention, timing of the falling $S_0$ and the rising $S_2$ during the transition from $P_{01}$ to $P_{12}$ is not critical. If there is a large capacitive load on the output signal, $P_{out}$, it may be advantageous to select more than two phases simultaneously during normal operating mode. For example, if three phases are selected at the same time, it is guaranteed that at least two will be active during any transition of the select signals.

Figure 4A:
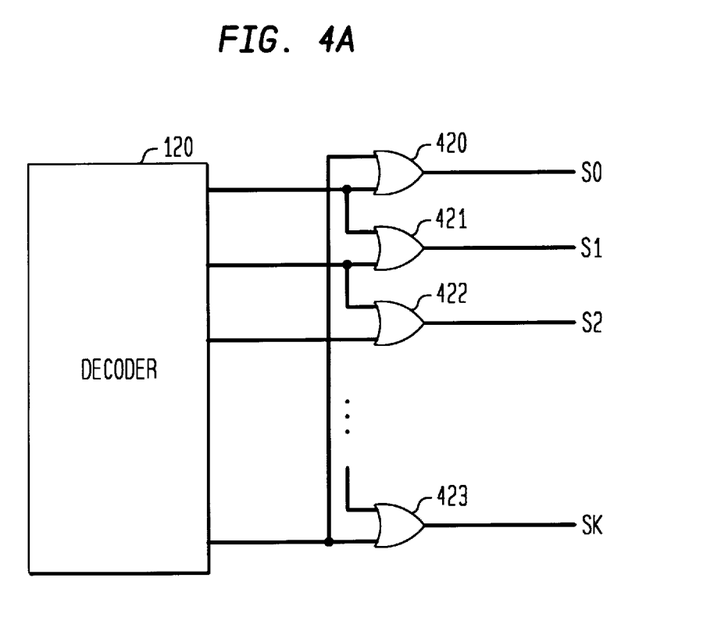
FIGS. 4A and 4B are schematic diagrams illustrating a decoder of FIG. 1A and related circuitry for implementing various embodiments of the present invention.

FIG. 4A illustrates a conventional decoder 120 and related circuitry 420–423 for implementing one embodiment of the present invention. As previously indicated, the decoder 120 converts a binary value (received from the counter 115 in FIG. 1A) into a "high" logic value on the appropriate selector line, $S_i$. Thus, only one of the selector lines, $S_i$, will have a high logic value and the remaining selector lines, $S_j$, will have a low logic value. The circuitry 420–423 shown in FIG. 4A ensures that two neighboring clock phases are simultaneously selected at a given time. Specifically, each "OR" gate 420–423 will provide a high logic value if any of its inputs is a high logic value. Thus, since each output of the decoder 120 is wired to an associated OR gate 420–423, and to an adjacent OR gate, two neighboring clock phases will always be selected. It is noted that if the decoder 120 does not have an ideal output during a transition, such that one and only one of the selector lines, $S_i$, will have a high logic value, the circuitry 420–423 can be improved by having a flip-flop at the output of the OR gates 420–423.

Figure 4B:
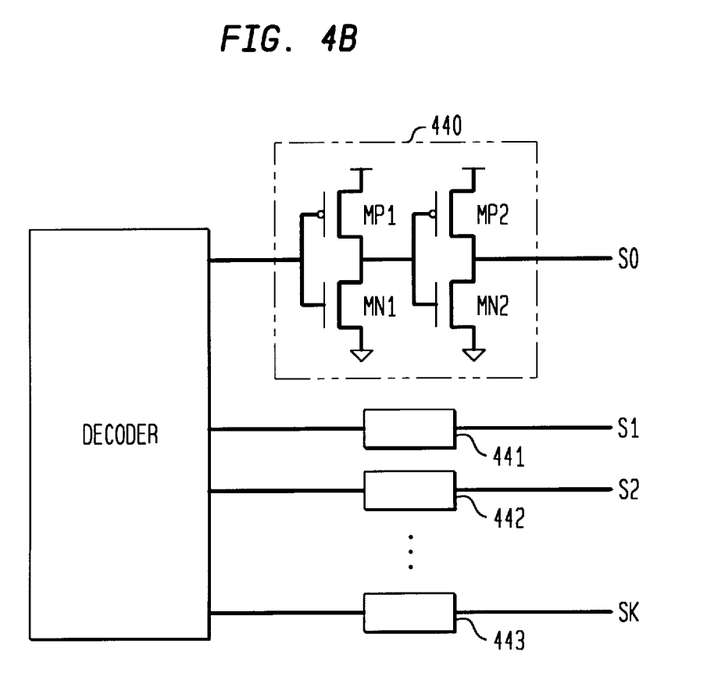

In an alternate embodiment of the present invention, two neighboring clock phases are simultaneously selected during a transition by ensuring that the desired clock phase signal is activated before the currently selected clock phase signal is deactivated. FIG. 4B illustrates a conventional decoder 120 and related circuitry 440–443 for implementing an alternate embodiment of the present invention. As previously indicated, only one of the selector lines, $S_i$, generated by the decoder 120 will have a high logic value and the remaining selector lines, $S_i$, will have a low logic value. The circuitry 440–443 shown in FIG. 4A ensures that the desired clock phase signal is activated before deactivating the currently selected clock phase signal. Specifically, each circuit 440–443 includes four metal oxide semiconductor (MOS) transistors, $MP_1, MN_1, MP_2, MN_2$, where $MP_1$ and $MN_2$ are slower transistors than $MN_1$ and $MP_2$, such that falling edges will be delayed by the circuit 440–443 more than rising edges.

Figure 5:
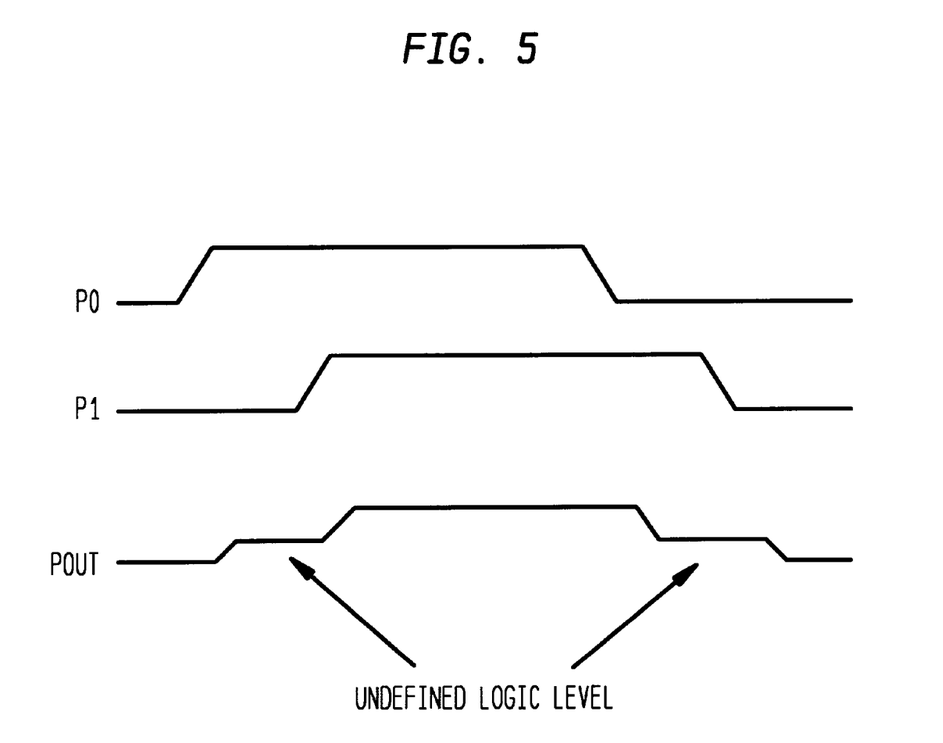
FIG. 5 illustrates the various input clock signals, $P_0$ through $P_2$, for a programmable selector, and the corresponding output signal, $P_{out}$, in accordance with a further feature of the present invention.

The present invention will not exhibit glitches or other signal integrity problems caused by two stages 310, 320, 330 fighting each other at the clock transition, even if the clock frequency is approaching or exceeding the switching speed of the selector 125. It has been observed, however, that the output signal, $P_{out}$, might have an undefined level for a portion of a clock period during normal operation, as illustrated in FIG. 5, if operated at a lower speed, for example, during testing of the integrated circuit.

At such lower operating speeds, the phases of the input signals, $P_0$, $P_1$ and $P_2$, (FIG. 3B) have a large spacing. At such lower frequencies, $P_0$ can be high while $P_1$ is low, resulting in stage 310 pulling $P_{out}$ high at the same time as stage 320 pulls $P_{out}$ low. Thus, the net effect, shown in FIG. 5, is that $P_{out}$ will have a value somewhere between a low and a high logic value. To redeem this situation, the dual-driving mode should be programmable. During testing or other low-speed operation (where a large spacing can be expected between the phases), only a single stage is activated to select a phase. At high speed, two (or more) phases are selected simultaneously as described above.

It is to be understood that the embodiments and variations shown and described herein are merely illustrative of the principles of this invention and that various modifications may be implemented by those skilled in the art without departing from the scope and spirit of the invention.

We claim:

1. A phase-locked loop (PLL) circuit for generating a clock signal, comprising:
   a selector for selecting from among a plurality of clock signals, each of said plurality of clock signals having a different phase, wherein said selector ensures at least one of said clock signals is selected at all times and for all conditions for which said PLL is normally operating; and
   a phase detector for comparing said selected clock signals to a reference input, wherein a signal is generated at the output of said phase detector indicating whether the phase difference between said reference input and said selected clock signal is positive or negative.

2. The phase-locked loop (PLL) circuit according to claim 1, wherein said plurality of clock signals are generated by a voltage-controlled oscillator (VCO).

3. The phase-locked loop (PLL) circuit according to claim 1, wherein said plurality of clock signals are generated by a voltage-controlled delay line.

4. The phase-locked loop (PLL) circuit according to claim 1, wherein said signal generated at the output of said phase detector loop is filtered by a low pass filter.

5. The phase-locked loop (PLL) circuit according to claim 1, wherein said selector selects at least two of said clock signals at a given time.

6. The phase-locked loop (PLL) circuit according to claim 1, wherein said selector activates a desired one of said clock signals before deactivating a selected one of said clock signals.

7. The phase-locked loop (PLL) circuit according to claim 1, wherein said PLL circuit is programmable so that only a single clock signal can be selected during low speed operation.

8. A phase-locked loop (PLL) circuit for generating a clock signal, comprising:
   a selector for selecting from among a plurality of clock signals, each of said plurality of clock signals having a different phase, wherein said selector selects at least two of said clock signals during a transition from one selected clock signal to another selected clock signal; and
   a phase detector for comparing said selected clock signals to a reference input, wherein a signal is generated at the output of said phase detector indicating whether the phase difference between said reference input and said selected clock signal is positive or negative.

9. The phase-locked loop (PLL) circuit according to claim 8, wherein said plurality of clock signals are generated by a voltage-controlled oscillator (VCO).

10. The phase-locked loop (PLL) circuit according to claim 8, wherein said plurality of clock signals are generated by a voltage-controlled delay line.

11. The phase-locked loop (PLL) circuit according to claim 8, wherein said signal generated at the output of said phase detector loop is filtered by a low pass filter.

12. The phase-locked loop (PLL) circuit according to claim 8, wherein said PLL circuit is programmable so that only a single clock signal can be selected during low speed operation.

13. The phase-locked loop (PLL) circuit according to claim 8, wherein said selector selects at least two of said clock signals at a given time.

14. A phase-locked loop (PLL) circuit for generating a clock signal, comprising:
   a selector for selecting from among a plurality of clock signals, each of said plurality of clock signals having a different phase, wherein said selector selects at least two of said clock signals at a given time; and
   a phase detector for comparing said selected clock signals to a reference input, wherein a signal is generated at the output of said phase detector indicating whether the phase difference between said reference input and said selected clock signal is positive or negative.

15. The phase-locked loop (PLL) circuit according to claim 14, wherein said plurality of clock signals are generated by a voltage-controlled oscillator (VCO).

16. The phase-locked loop (PLL) circuit according to claim 14, wherein said plurality of clock signals are generated by a voltage-controlled delay line.

17. The phase-locked loop (PLL) circuit according to claim 14, wherein said signal generated at the output of said phase detector loop is filtered by a low pass filter.

18. The phase-locked loop (PLL) circuit according to claim 14, wherein said PLL circuit is programmable so that only a single clock signal can be selected during low speed operation.

19. A phase-locked loop (PLL) circuit for generating a clock signal, comprising:
   a selector for selecting from among a plurality of clock signals, each of said plurality of clock signals having a different phase, wherein said selector activates a desired one of said clock signals before deactivating a selected one of said clock signals; and
   a phase detector for comparing said selected clock signals to a reference input, wherein a signal is generated at the output of said phase detector indicating whether the phase difference between said reference input and said selected clock signal is positive or negative.

20. The phase-locked loop (PLL) circuit according to claim 19, wherein said plurality of clock signals are generated by a voltage-controlled oscillator (VCO).

21. The phase-locked loop (PLL) circuit according to claim 19, wherein said plurality of clock signals are generated by a voltage-controlled delay line.

22. The phase-locked loop (PLL) circuit according to claim 19, wherein said signal generated at the output of said phase detector loop is filtered by a low pass filter.

23. The phase-locked loop (PLL) circuit according to claim 19, wherein said PLL circuit is programmable so that only a single clock signal can be selected during low speed operation.

24. A method for generating a clock signal, said method comprising the steps of:
 selecting from among a plurality of clock signals for use in a phase-locked loop circuit, each of said plurality of clock signals having a different phase, wherein said selection step ensures at least one of said clock signals is selected at all times and for all conditions for which said phase-locked loop circuit is normally operating; and
 generating an error signal corresponding to the difference in phase between said selected clock signals and a reference input; and
 applying said error signal to said selector, said selected clock signals tracking the phase of the reference input.

25. The method according to claim 24, wherein said selection step selects at least two of said clock signals during a transition from one selected clock signal to another selected clock signal.

26. The method according to claim 24, wherein said selection step selects at least two of said clock signals at a given time.

27. The method according to claim 24, wherein said selection step activates a desired one of said clock signals before deactivating a selected one of said clock signals.

28. A phase-locked loop (PLL) circuit for generating a clock signal, comprising:
 means for selecting from among a plurality of clock signals, each of said plurality of clock signals having a different phase, wherein said selection step ensures at least one of said clock signals is selected at all times and for all conditions for which said PLL can be operated; and
 means for generating an error signal corresponding to the difference in phase between said selected clock signals and a reference input.

29. The phase-locked loop (PLL) circuit according to claim 28, wherein said plurality of clock signals are generated by a voltage-controlled oscillator (VCO).

30. The phase-locked loop (PLL) circuit according to claim 28, wherein said plurality of clock signals are generated by a voltage-controlled delay line.

31. The phase-locked loop (PLL) circuit according to claim 28, wherein said error signal is filtered by a low pass filter.

32. The phase-locked loop (PLL) circuit according to claim 28, wherein said selector selects at least two of said clock signals during a transition from one selected clock signal to another selected clock signal.

33. The phase-locked loop (PLL) circuit according to claim 28, wherein said selector selects at least two of said clock signals at a given time.

34. The phase-locked loop (PLL) circuit according to claim 28, wherein said selector activates a desired one of said clock signals before deactivating a selected one of said clock signals.

35. The phase-locked loop (PLL) circuit according to claim 28, wherein said PLL circuit is programmable so that only a single clock signal can be selected during low speed operation.

36. A phase-locked loop (PLL) circuit for generating a clock signal, comprising:
 a selector for selecting from among a plurality of clock signals, wherein at least two of said plurality of clock signals have a different phase and wherein said selector ensures at least one of said clock signals is selected at all times and for all conditions when said PLL is normally operating; and
 a phase detector for comparing said selected clock signals to a reference input, wherein a signal is generated at the output of said phase detector indicating whether the phase difference between said reference input and said selected clock signal is positive or negative.

37. The phase-locked loop (PLL) circuit according to claim 36, wherein said selector selects at least two of said clock signals at a given time.

38. The phase-locked loop (PLL) circuit according to claim 36, wherein said selector activates a desired one of said clock signals before deactivating a selected one of said clock signals.

39. The phase-locked loop (PLL) circuit according to claim 36, wherein said PLL circuit is programmable so that only a single clock signal can be selected during low speed operation.

40. A phase-locked loop (PLL) circuit for generating a clock signal, comprising:
 one or more signal generators for generating a plurality of clock signals, at least two of said plurality of clock signals having a different phase; and
 a selector for selecting from among said plurality of clock signals, wherein said selector ensures at least one of said clock signals is selected at all times and for all conditions when said PLL can be operated, wherein said selected clock signals track the phase of a reference input.

41. The phase-locked loop (PLL) circuit according to claim 40, wherein said selector selects at least two of said clock signals at a given time.

42. The phase-locked loop (PLL) circuit according to claim 40, wherein said selector activates a desired one of said clock signals before deactivating a selected one of said clock signals.

43. The phase-locked loop (PLL) circuit according to claim 40, wherein said PLL circuit is programmable so that only a single clock signal can be selected during low speed operation.

44. A method for selecting a clock signal in a phase-locked loop (PLL) circuit from among a plurality of clock signals having different phases, said method comprising the step of:

selecting from among said plurality of clock signals for use in a phase-locked loop (PLL) circuit, wherein said selecting step ensures at least one of said clock signals is selected at all times and for all conditions when said PLL is normally operating and said selected clock signals track the phase of a reference input.

45. The method according to claim 44, wherein said selecting step further comprises the step of selecting at least two of said clock signals at a given time.

46. The method according to claim 44, wherein said selecting step further comprises the step of activating a desired one of said clock signals before deactivating a selected one of said clock signals.

47. The method according to claim 44, further comprising the step of selecting only a single clock signal during low speed operation.

* * * * *